(12) United States Patent
Botula et al.

(10) Patent No.: US 9,530,711 B2
(45) Date of Patent: Dec. 27, 2016

(54) SILICON-ON-INSULATOR HEAT SINK (71) Applicant: INTERNATIONAL BUSINESS MACHINES CORPORATION, Armonk, NY (US)

(72) Inventors: Alan B. Botula, Essex Junction, VT (US); Alvin J. Joseph, Williston, VT (US); James A. Slinkman, Montpelier, VT (US); Randy L. Wolf, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/715,693

(22) Filed: May 19, 2015

(65) Prior Publication Data

US 2015/0255363 A1 Sep. 10, 2015

Related U.S. Application Data

(62) Division of application No. 13/738,532, filed on Jan. 10, 2013, now Pat. No. 9,059,269.

(51) Int. Cl.
| | |
|---|---|
| *H01L 29/76* | (2006.01) |
| *H01L 29/66* | (2006.01) |
| *H01L 27/12* | (2006.01) |
| *H01L 21/84* | (2006.01) |
| *H01L 23/24* | (2006.01) |
| *H01L 23/34* | (2006.01) |
| *H01L 29/78* | (2006.01) |
| *H01L 23/367* | (2006.01) |

(52) U.S. Cl.
CPC ............. *H01L 23/34* (2013.01); *H01L 21/84* (2013.01); *H01L 27/1203* (2013.01); *H01L 29/665* (2013.01); *H01L 29/78* (2013.01); *H01L 29/7841* (2013.01); *H01L 23/3677* (2013.01); *H01L 2924/0002* (2013.01)

(58) Field of Classification Search
CPC ..... H01L 23/24; H01L 29/665; H01L 27/1203
USPC ....................................................... 257/347
See application file for complete search history.

(56) References Cited

U.S. PATENT DOCUMENTS 5,366,923 A * 11/1994 Beyer ................. H01L 21/2007
148/DIG. 12
6,222,254 B1 * 4/2001 Liang ................ H01L 21/76224
257/327
6,352,882 B1 * 3/2002 Assaderaghi ........... H01L 21/84
257/E21.703

(Continued)

FOREIGN PATENT DOCUMENTS

| EP | 2400538 A1 | 12/2011 |
|---|---|---|
| JP | 10199882 A | 7/1998 |
| JP | 2007235157 A | 9/2007 |

*Primary Examiner* — Moazzam Hossain
(74) *Attorney, Agent, or Firm* — Michael LeStrange; Andrew M. Calderon; Roberts Mlotkowski Safran Cole & Calderon, P.C.

(57) ABSTRACT

An approach for sinking heat from a transistor is provided. A method includes forming a substrate contact extending from a first portion of a silicon-on-insulator (SOI) island to a substrate. The method also includes forming a transistor in a second portion of the SOI island. The method further includes electrically isolating the substrate contact from the transistor by doping the first portion of the SOI island.

19 Claims, 8 Drawing Sheets

(56) References Cited

U.S. PATENT DOCUMENTS

| | | | |
|---|---|---|---|
| 6,501,153 B2* | 12/2002 | Oue | H01L 23/3677 257/622 |
| 6,573,565 B2* | 6/2003 | Clevenger | H01L 21/76264 257/347 |
| 7,342,294 B2 | 3/2008 | Ouyang et al. | |
| 7,446,417 B2 | 11/2008 | Yoshioka | |
| 7,656,027 B2 | 2/2010 | Dangelo et al. | |
| 7,675,121 B2 | 3/2010 | Dang et al. | |
| 8,217,455 B2 | 7/2012 | Abou-Khalil et al. | |
| 8,598,636 B2 | 12/2013 | Huang et al. | |
| 2004/0022102 A1* | 2/2004 | Liang | H01L 21/76224 365/200 |
| 2005/0029643 A1 | 2/2005 | Koyanagi | |
| 2006/0121710 A1 | 6/2006 | Liang et al. | |
| 2006/0145270 A1* | 7/2006 | Choi | H01L 21/28123 257/384 |
| 2006/0278901 A1 | 12/2006 | Dangelo et al. | |
| 2007/0001262 A1* | 1/2007 | Ouyang | H01L 27/1203 257/565 |
| 2007/0007595 A1 | 1/2007 | Hirano et al. | |
| 2008/0224257 A1 | 9/2008 | Mori | |
| 2009/0250739 A1 | 10/2009 | Johnson et al. | |
| 2009/0256202 A1 | 10/2009 | Abou-Khalil et al. | |
| 2010/0144106 A1* | 6/2010 | Cho | H01L 27/108 438/243 |
| 2011/0012223 A1 | 1/2011 | Molin et al. | |
| 2011/0169065 A1* | 7/2011 | Cheng | H01L 21/84 257/301 |
| 2012/0075216 A1 | 3/2012 | Black et al. | |
| 2012/0146098 A1 | 6/2012 | Dahlstrom et al. | |
| 2012/0146150 A1* | 6/2012 | Gauthier, Jr. | H01L 23/60 257/355 |
| 2012/0181663 A1 | 7/2012 | Lukaitis et al. | |
| 2012/0184080 A1 | 7/2012 | Lukaitis et al. | |
| 2014/0008756 A1* | 1/2014 | Pei | H01L 23/3677 257/506 |

* cited by examiner

SILICON-ON-INSULATOR HEAT SINK

FIELD OF THE INVENTION

The present invention relates to integrated circuit devices and, more particularly, to methods and systems for dissipating heat in silicon-on-insulator semiconductor devices.

BACKGROUND

Silicon-on-insulator is the process of fabricating silicon based devices, such as complementary metal oxide semiconductor (CMOS) field effect transistors (FET) on top of a layer of electrically insulating material, such as an oxide. The layer of oxide is on top of a bulk silicon substrate in an integrated circuit (IC) chip and acts as an electrical barrier between the devices (e.g., FETs) and the bulk silicon. The layer of oxide greatly reduces electrical leakage from the devices, but also greatly reduces heat flow from these devices. Accumulation of heat within a device, such as a FET, can reduce the performance and/or useful lifetime of the device.

Heat can be removed from a FET using wiring that is formed over the FET as a heat path for transferring heat away from the FET and out of the top of the chip. Such wiring, however, typically has a primary purpose of carrying electric current within the chip. The electric current generates its own heat within the wiring through resistive heating, and the combination of resistive heating and heat transfer from FETs can degrade the current handling capacity of the wiring.

Accordingly, there exists a need in the art to overcome the deficiencies and limitations described hereinabove.

SUMMARY

In a first aspect of the invention, a method of manufacturing a semiconductor structure includes forming a substrate contact extending from a first portion of a silicon-on-insulator (SOI) island to a substrate. The method also includes forming a transistor in a second portion of the SOI island. The method further includes electrically isolating the substrate contact from the transistor by doping the first portion of the SOI island.

In another aspect of the invention, a method of manufacturing a semiconductor device includes: defining an island in a semiconductor layer of a silicon-on-insulator (SOI) wafer; and forming a trench through the island and an underlying buried insulator layer, wherein the trench extends to or into a substrate under the buried insulator layer. The method also includes forming a substrate contact in the trench, wherein the substrate contact comprises a material having a thermal conductivity that is greater than a thermal conductivity of the buried insulator layer. The method further includes: forming a transistor in the island; and electrically isolating the substrate contact from the transistor by doping a portion of the island.

In yet another aspect of the invention, a semiconductor structure includes: a substrate; a buried insulator layer on the substrate; and an island of a semiconductor layer on the buried insulator layer. The semiconductor structure also includes a substrate contact extending from a first area of the island to the substrate through the buried insulator layer. The semiconductor structure also includes a transistor in a second area of the island. The substrate contact comprises a material having a thermal conductivity that is greater than a thermal conductivity of the buried insulator layer. The substrate contact is electrically isolated from the transistor.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a substrate contact and/or SOI heat sink which comprises the structures of the present invention. In still further embodiments, a method in a computer-aided design system is provided for generating a functional design model of the substrate contact and/or SOI heat sink. The method comprises generating a functional representation of the structural elements of the substrate contact and/or SOI heat sink.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to testing integrated circuit devices and, more particularly, to methods and systems for dissipating heat in silicon-on-insulator semiconductor devices. According to aspects of the invention, a thermally conductive and electrically insulative substrate contact is formed between an SOI island and a substrate, e.g., through a buried insulator layer. In embodiments, the substrate contact is formed with a same or similar material as the SOI island and the substrate, e.g., silicon, which has a higher thermal conductivity than the material of the buried insulator layer, e.g., oxide. Moreover, a portion of the SOI island surrounding the substrate contact is doped to provide electrical isolation from a device (e.g., a FET) formed in another portion of the SOI island. In this manner, implementations of the invention provide a thermal path from the SOI island to the substrate so that the substrate can serve as a heat sink for a device (e.g., a FET) formed in the SOI island.

In accordance with aspects of the invention, there is a thermal channel/heat sink implemented in a silicon-on-insulator semiconductor manufacturing process, comprising: a thermal via (e.g., substrate contact) formed in a first buried oxide layer and contacting a high resistance silicon substrate on a first end and a SOI device contact on a second end. The thermal via comprises an electrically resistive and thermally conducting material. Implementations of the invention take advantage of the existing thin SOI silicon layer and substrate contact through the buried oxide later (e.g., $SiO_2$) to provide a heat sink for the device without requiring additional layers to channel the heat from that device to the bulk silicon beneath. By adjusting the doping of these channels, the channels can be kept thermally conductive, while at the same time making the channel electrically resistive, which prevents loading down the device with parasitics often associated with the other heat sinking methods. Methods in accordance with aspects of the invention allow heavy doping of these same channels to provide a good electrical ground when desired. Implementations of the invention may be applied to any front-end-of-line device, can be adapted to thick-film SOI, and can employ npn junctions to further isolate the device from the substrate contact. In embodiments, heat build-up in the SOI device can be greatly reduced by etching around the active device and through the buried insulator layer so that a substrate contact comprising thermally conductive material (e.g., polysilicon, Tungsten, Copper, etc.) can be formed. The substrate contact permits the heat generated by the SOI device to be channeled through the buried insulator layer to the bulk silicon substrate.

Figure 1:
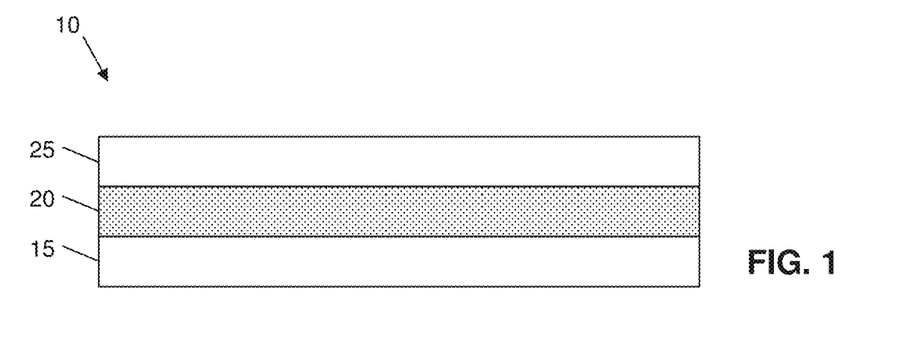
FIGS. 1-18 show processing steps and structures in accordance with aspects of the invention.

FIGS. 1-18 show processing steps and respective structures in accordance with aspects of the invention. Specifically, FIG. 1 shows an exemplary SOI wafer 10 employed as an intermediate structure in implementations of the invention. The SOI wafer 10 has a bulk semiconductor substrate 15, which is typically a bulk silicon substrate, a buried insulator layer 20 formed on the substrate 15, and a semiconductor layer 25, which is typically a silicon layer formed on the buried insulator layer 20. The SOI wafer 10 may be fabricated using techniques understood by those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. In a particular exemplary embodiment, the substrate 15 is a high-resistivity silicon substrate having a resistivity of about 1000 ohm-cm or greater. The buried insulator layer 20 may be composed of oxide, such as $SiO_2$, and may be referred to as a buried oxide (BOX) layer 20. Moreover, although the SOI wafer is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

In embodiments, the SOI wafer 10 has a thickness of about 700 μm, with the BOX layer 20 having a thickness in a range of about 0.4 μm to about 1 μm, and the semiconductor layer 25 having a thickness in a range of about 0.1 μm to about 0.2 μm, and more particularly about 0.145 μm. However, the invention is not limited to these dimensions, and the various portions of the SOI wafer may have any desired thicknesses based upon the intended use of the final semiconductor device.

Figure 2:
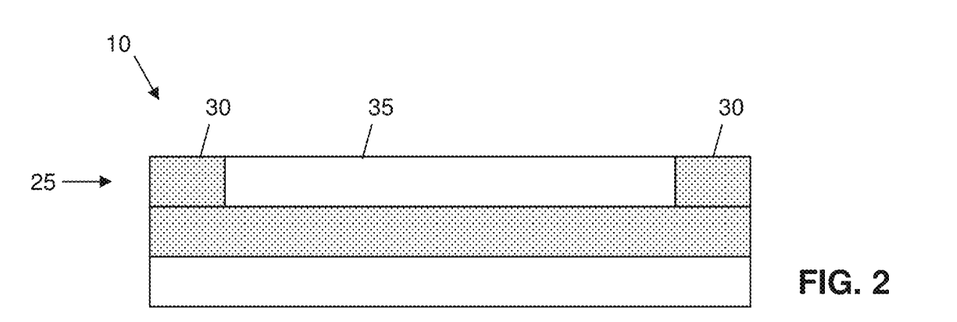

As shown in FIG. 2, shallow trench isolation (STI) structures 30 are formed in the wafer 10. The STI 30 may be conventional shallow trench isolation structures formed using conventional semiconductor fabrication processes and materials. For example, the STIs 30 may be formed by arranging a photoresist material on the semiconductor layer 25, exposing and developing the photoresist, etching an STI trench in the semiconductor layer 25 through the patterned photoresist (e.g., using a reactive ion etch (RIE) process), stripping the photoresist, filling the trench with an STI material (e.g., $SiO_2$), and planarizing the top surface of the structure (e.g., via chemical mechanical polish (CMP)). The STI 30 locally replaces a portion of the semiconductor layer 25. The remaining portion of the semiconductor layer 25 that is surrounded by the STI 30 is referred to as an island 35.

Figure 3:
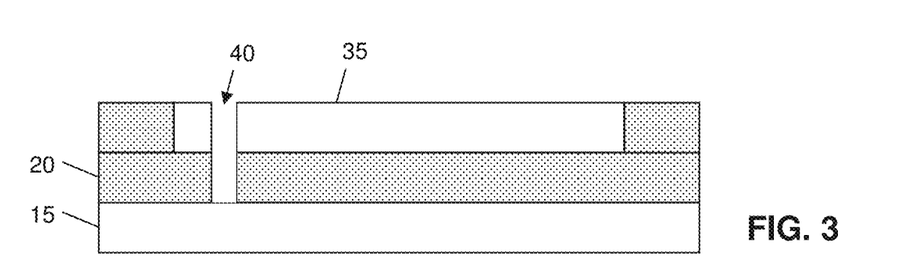

As shown in FIG. 3, a substrate contact trench 40 is formed through the island 35 and the BOX layer 20 to the substrate 15. In embodiments, the substrate contact trench 40 is formed using one or more lithography (e.g., masking and etching) processes. For example, a photoresist material may be formed on the wafer 10 and patterned into a mask, and one or more RIE processes may be used to etch portions of the wafer 10 through an opening in the mask. A respective RIE process may be performed for etching each of the island 35 and the BOX layer 20, with each respective RIE process being tailored to the material of the layer/feature being etched. Additionally, a single RIE process may be used to etch more than one layer/feature.

The substrate contact trench 40 may have any desired size and shape, and more than one substrate contact trench 40 may be formed at different locations in the island 35. In accordance with aspects of the invention, the substrate contact trench 40 may be located anywhere within the island 35 outside of a footprint (e.g., in top-down plan view) where a FET will later be formed in the island 35. In embodiments, the substrate contact trench 40 is formed through the entire depth of the BOX layer 20 to expose an upper surface of the substrate 15, and may optionally extend into the substrate 15.

Figure 4:
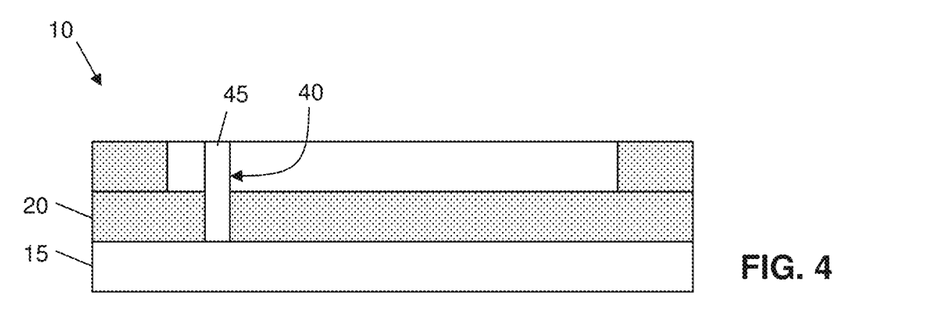

As depicted in FIG. 4, a substrate contact 45 is formed in the substrate contact trench 40 and in direct physical contact with the substrate 15. According to aspects of the invention, the substrate contact 45 is composed of a material that has a thermal conductivity that is substantially greater than the thermal conductivity of the material of the BOX layer 20. In embodiments, the BOX layer is composed of $SiO_2$, which has a nominal thermal conductivity of about 0.1 W/(cm·K), and the substrate contact 45 is composed of silicon, which has a nominal thermal conductivity of about 1.5 W/(cm·K).

The substrate contact 45 may be formed using conventional semiconductor fabrication techniques. In embodiments, the substrate contact 45 is composed of undoped polysilicon and is formed using a low pressure chemical vapor deposition (LPCVD) process, although other high thermal conductivity materials may be provided using other formation processes. The top surface of the wafer 10 may be planarized, e.g., using CMP, after forming the substrate contact 45 in the substrate contact trench 40.

Figure 5:
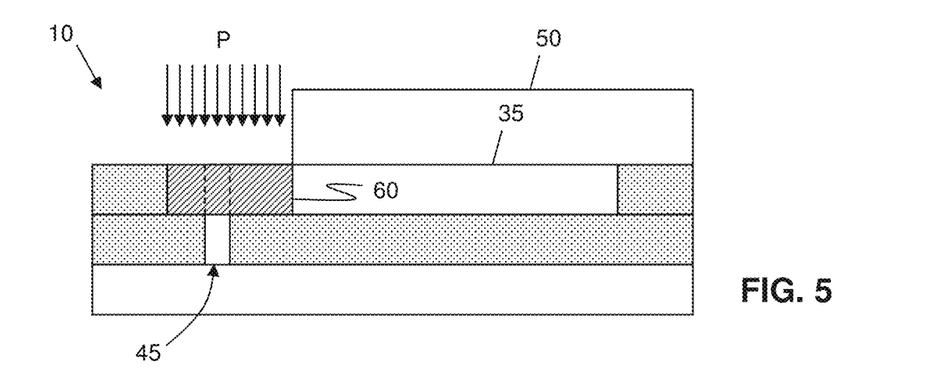

FIG. 5 shows the formation of a mask 50 on the wafer 10 with an opening defined over a portion of the island 35 containing the substrate contact 45. The mask 50 may be formed using conventional materials and techniques, such as photolithography.

Still referring to FIG. 5, the unmasked portion of the island 35 is doped as indicated by arrows "P". The doping may be performed using conventional techniques, such as ion implantation of p-type impurities (e.g., boron) or n-type impurities (e.g., arsenic or phosphorous). In accordance with aspects of the invention, the type of impurity implanted in the unmasked portion of the island 35 is opposite the type of impurity that is used in source/drain regions of a FET formed in the island 35. For example, the unmasked portion is described herein as being doped with a p-type impurity to create a P+ region 60 in the island 35. The mask 60 is removed (e.g., stripped) after forming the P+ region 60.

Figure 6:
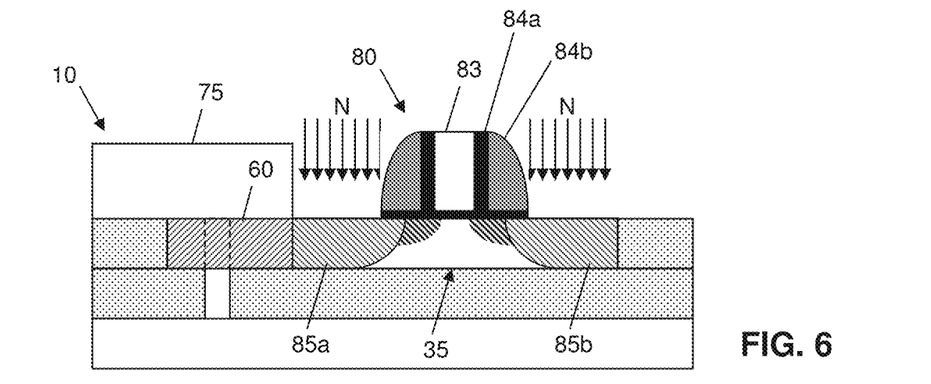

As depicted in FIG. 6, another mask 75 is formed over the P+ region 60 and an NFET 80 is formed in the island 35 adjacent the P+ region 60. The mask 75 may comprise any suitable mask (e.g., photomask, hardmask, etc.) that protects the P+ region 60 during ion implantation steps performed in making the NFET 80. The mask 75 may comprise a single mask that remains on the P+ region 60 throughout the duration of forming the NFET 80. Alternatively, the mask 75 may represent plural masks that are formed and then removed at particular stages during the fabrication of the NFET 80.

The NFET 80 may be of any desired configuration, and may be formed using conventional CMOS fabrication techniques and materials. For example, the NFET 80 may be formed by first forming a gate dielectric on the upper surface of the wafer 10 including the top surface of the island 35, forming a gate conductor on the gate dielectric, and patterning the gate conductor and the gate dielectric to form a gate 83 on the unmasked portion of the island 35. The gate dielectric may be any suitable material, including, for example, high-k dielectrics such as hafnium-based materials. The gate conductor can be any suitable material, such as doped polysilicon or other metal. Sidewall spacers 84a may be formed on the gate 83. Shallow source/drain extension regions (e.g., pocket implants) may be formed in the island 35 by performing an ion implantation of n-type impurities using the gate as a mask. The mask 75 masks the P+ region 60 during the ion implantation that forms the shallow source/drain extension regions. Sidewall spacers 84b may be formed on the first sidewall spacers. Source/drain regions 85a/85b may be formed in the island 35 by performing another ion implantation of n-type impurities using the second sidewall spacers as a mask, e.g., as shown at arrows "N". The mask 75 masks the P+ region 60 during the ion implantation that forms the source/drain regions 85a/85b. The mask 75 is removed (e.g., stripped) after forming the NFET 80.

Aspects of the invention are described herein with respect to an NFET 80 having N+ type source/drain regions 85a/85b and a P+ region 60 in the SOI island 35. It is noted, however, that the invention may also be implemented with a PFET having P+ type source/drain regions and an N+ region in the SOI island by altering the types of impurities used in the ion implantation steps.

Figure 7:
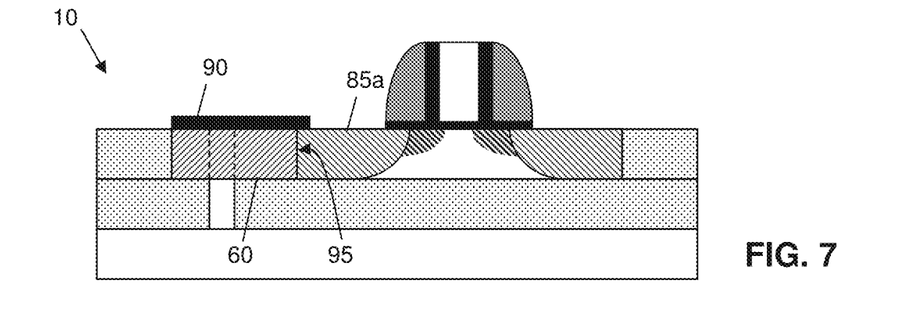

As shown in FIG. 7, a block 90 is formed on the P+ region 60 and partially on the source/drain region 85a that is adjacent the P+ region 60. In embodiments, the block 90 covers the entirety of an interface 95 between the P+ region 60 and the source/drain region 85a that is adjacent the P+ region 60. The block 90 may be composed of any suitable material that prevents the formation of silicide on the P+ region 60 in subsequent processing steps. For example, the block 90 may comprise nitride. The block 90 may be formed using conventional CMOS processing techniques, such as depositing a blanket layer of nitride on the entire wafer, and masking and etching the nitride to shape the block 90.

Figure 8:
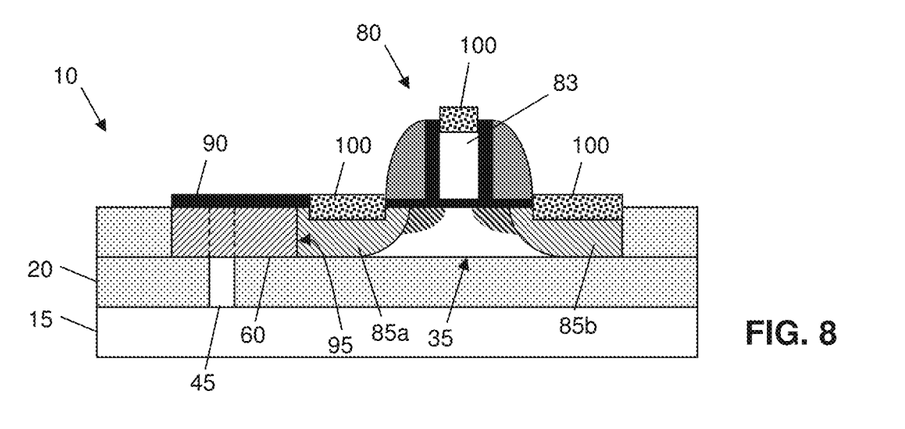

FIG. 8 shows the formation of silicide 100 on silicon-containing surfaces that are unmasked by the block 90, e.g., on the source/drain regions 85a/85b and the gate 83 of the NFET 80. The block 90 prevents silicide from forming on the P+ region 60 and also from forming on the interface 95, which ensures that the silicide 100 does not electrically short the source/drain region 85a to the P+ region 60. The silicide 100 may be formed using conventional CMOS processing techniques, such as: sputtering a layer of metal onto the top surface of the wafer; annealing the wafer to react the metal with silicon in places where the metal contacts silicon; and stripping any unreacted metal. Conventional back end of line processing may follow the silicide formation, such as forming one or more insulator layers on the top surface of the wafer 10 and forming any of contacts, vias, interconnects, and wires in the insulator layers.

The structure depicted in FIG. 8 comprises an NFET 80 and a substrate contact 45 formed in the same island 35 of an SOI wafer 10. According to aspects of the invention, the substrate contact 45 provides a low thermal resistance path for heat to travel from the NFET 80 to the substrate 15, where the heat can be efficiently dissipated. Specifically, the island 35 and substrate contact 45 are both composed of silicon, which has a much higher thermal conductivity (i.e., lower thermal resistance) than the oxide of the BOX layer 20. Moreover, the interface 95 between the P+ region 60 and the adjacent N+ source/drain region 85a electrically isolates the substrate contact 45 from the NFET 80. In this manner, the substrate contact 45 is prevented from shunting the NFET 80 to the substrate 15. Implementations of the invention thus provide a high-thermal conductivity heat path from the NFET 80 to the substrate 15, where the structure of the high-thermal conductivity heat path maintains electrical isolation of the NFET 80 from the substrate 15.

Still referring to FIG. 8, in accordance with aspects of the invention, the P+ region 60 and the source/drain regions 85a/85b are formed of the same material, e.g., the silicon that constitutes the SOI island 35. In embodiments, a different material (e.g., oxide) is not interposed between the P+ region 60 and the source/drain regions 85a/85b. In further embodiments, the substrate contact 45 and the substrate 15 are composed of the same material as the SOI island 35, e.g., silicon. In this manner, implementations of the invention provide a continuous silicon path extending from the channel of the NFET 80 to the substrate 15 in order to advantageously maximize heat transfer from the NFET 80 to the substrate 15.

Figure 9:
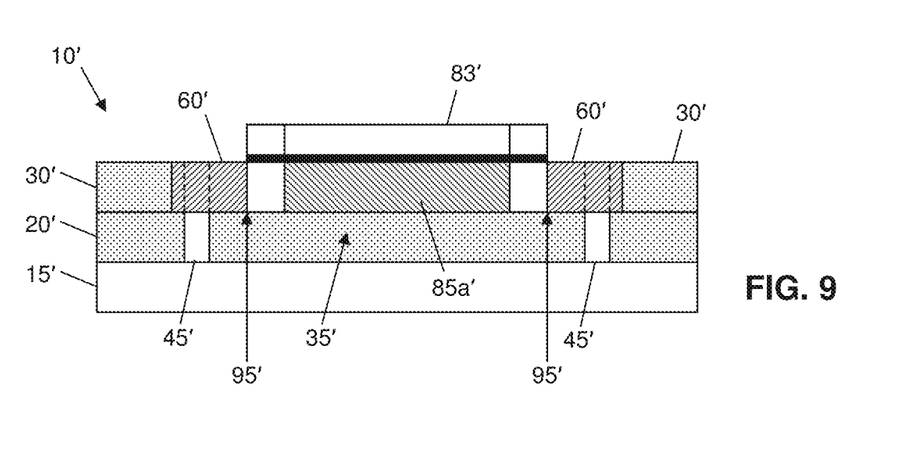
Figure 10:
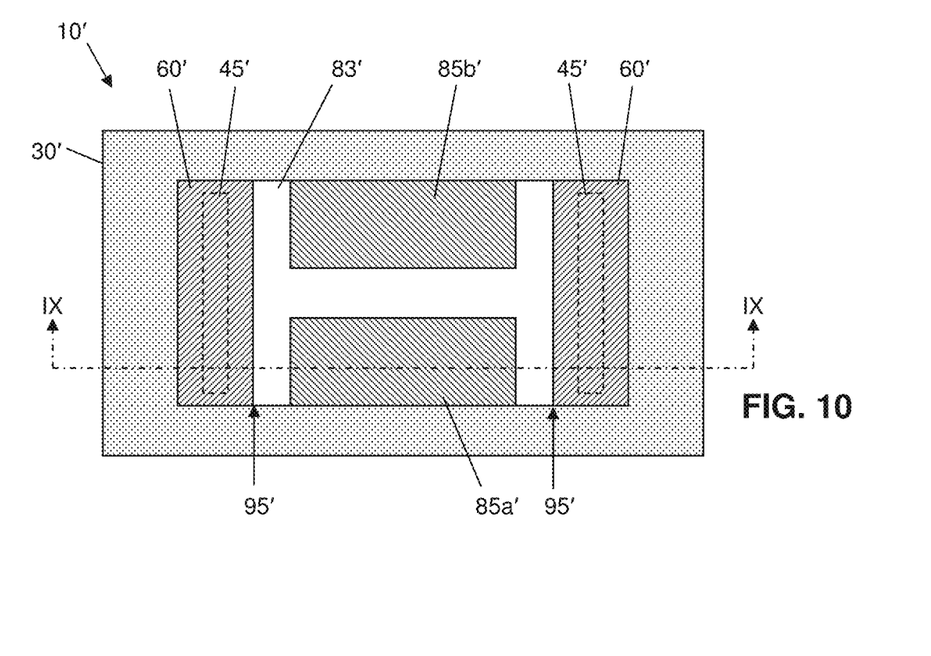

FIGS. 9 and 10 show an implementation of the substrate contact with a floating body NFET in accordance with aspects of the invention. In particular, FIG. 9 shows a cross section of an SOI wafer 10' comprising a substrate 15', BOX layer 20', STI 30', and SOI island 35'. FIG. 10 shows a plan view (e.g., top down view) of the wafer 10' of FIG. 9, with the cross section of FIG. 9 being taken along line IX-IX of FIG. 10.

As shown in FIG. 9, the wafer 10' includes at least one substrate contact 45' extending from a P+ region 60' of the island 35' to the substrate 15' (i.e., through the BOX layer 20'). With reference to FIGS. 9 and 10, an I-shaped or H-shaped gate 83' and source/drain regions 85a'/85b' are formed on the island 35' adjacent the P+ region 60' (only the source region 85a' is shown in FIG. 9). In embodiments, the substrate contact 45' is composed of silicon to provide a high thermal conductivity. The substrate contact 45' is electrically isolated from the source/drain regions 85a'/85b' by the interface 95' between the P+ region 60' and the N+ source/drain regions 85a'/85b'. The structure shown in FIGS. 9 and 10, including the floating body NFET, may be formed using CMOS processing steps similar to those described with respect to FIGS. 1-6 and by changing the configuration of certain ones of the masks to form the gate 83' and source/drain regions 85a'/85b' in different locations relative to the P+ region 60' and substrate contact 45'.

Figure 11:
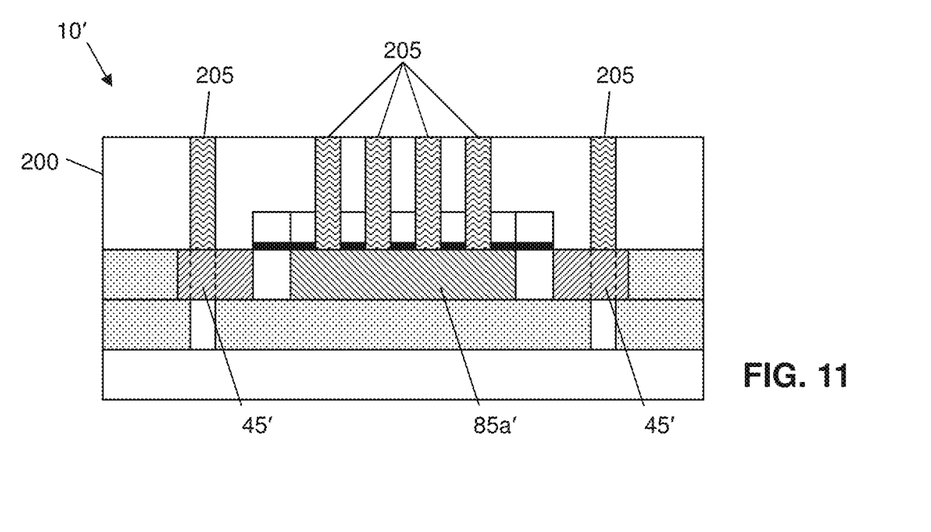

FIG. 11 shows the structure of FIG. 9 after forming an insulator layer 200 on the wafer 10' and electrical contacts 205 in the insulator layer 200. The insulator layer 200 and electrical contacts 205 may be formed using conventional CMOS processes and materials. For example, the insulator layer 200 may be formed by depositing an oxide (e.g., $SiO_2$ via CVD) over the entire top surface of the wafer 10'. The electrical contacts 205 may be formed by forming a photomask on the insulator layer 200, etching holes in the insulator layer 200 through the photomask, stripping the photomask, filling the holes with an electrically conductive material (e.g., copper, aluminum, etc.) using CVD, and planarizing the top surface of the wafer 10' using CMP.

Figure 12:
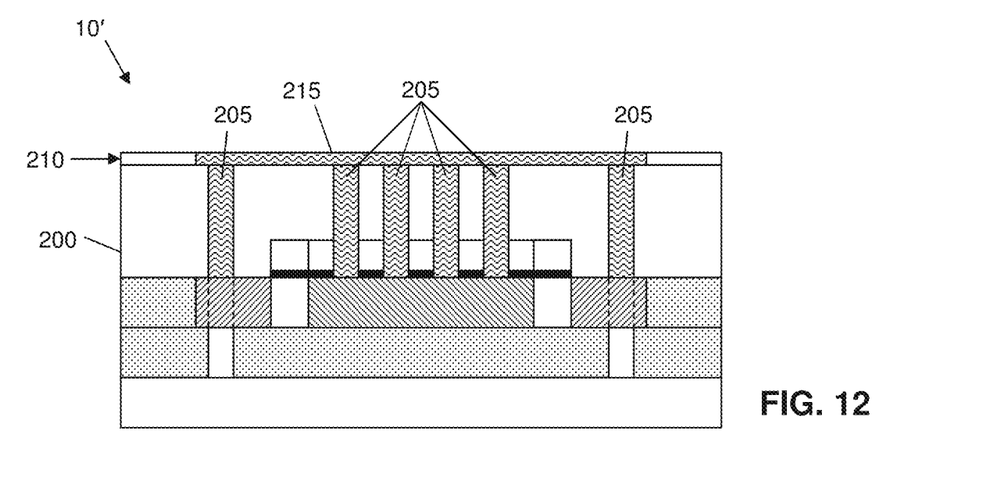

As depicted in FIG. 12, another insulator layer 210 and a metal layer 215 may be formed on the insulator layer 200 and electrical contacts 205. The insulator layer 210 and metal layer 215 may be formed in the same manner as insulator layer 200 and electrical contacts 205, e.g., using appropriate deposition, masking, etching, and planarizing steps.

Figure 13:
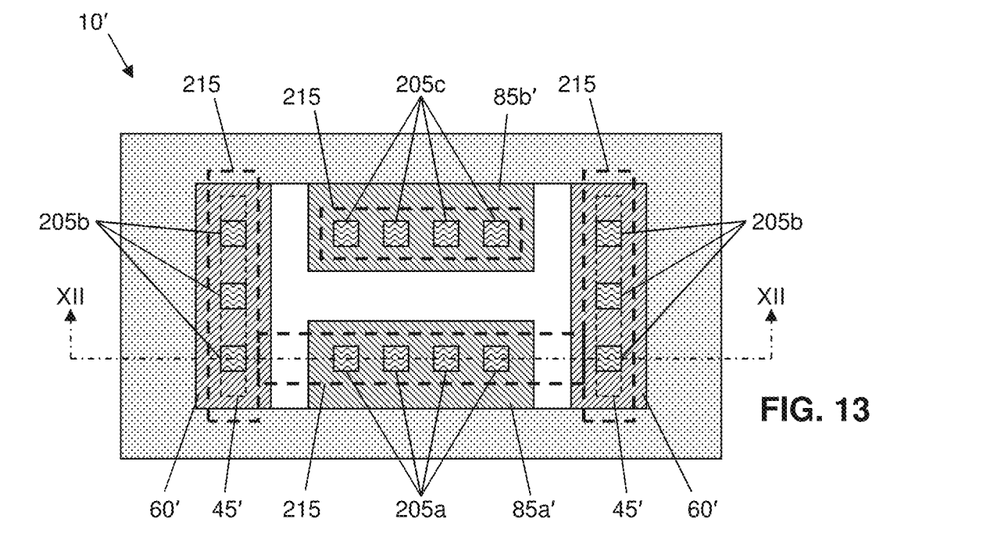

FIG. 13 is a plan view of the wafer 10' of FIG. 12, with the cross section of FIG. 12 being taken along line XII-XII of FIG. 13. As shown in FIGS. 12 and 13, some of the electrical contacts 205a are formed on the source 85a', while others of the contacts 205b are formed on the P+ region 60'. Moreover, a portion of the metal layer 215 is formed in contact with the electrical contacts 205a and the electrical contacts 205b, thus shorting the source 85a' to the substrate contact 45'. This structure grounds the source 85a' by electrically connecting the source 85a' to the substrate 15' through an electrically conductive path comprising the electrical contacts 205a and 205b, a portion of metal layer 215, P+ region 60' and substrate contact 45'.

As further depicted in FIG. 13, some of the electrical contacts 205c may be formed on the drain 85b'. However, the drain 85b' is electrically isolated from the substrate contact 45' by patterning the metal layer 215 such that there is a discontinuity in the metal layer 215, i.e., any portion of the metal layer 215 touching the electrical contacts 205c is physically separated from and does not contact the electrical contacts 205b associated with the substrate contact 45'.

Figure 14:
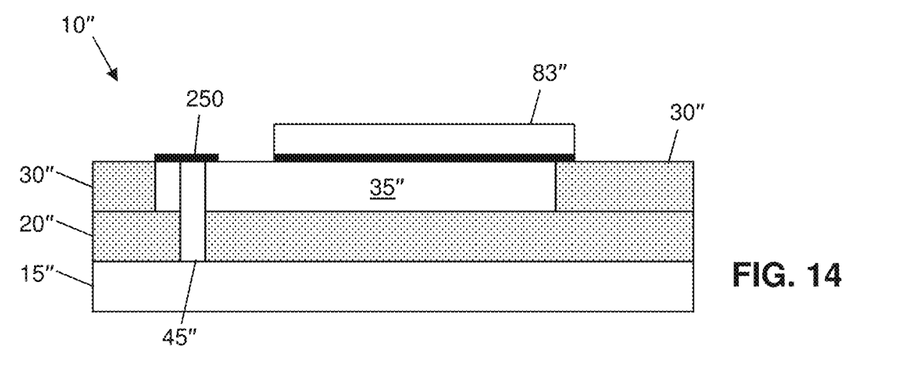

FIGS. 14-17 show an implementation of the substrate contact with a body contacted NFET in accordance with aspects of the invention. FIG. 14 shows a cross section of a wafer 10" comprising a substrate 15", BOX layer 20", STI 30", SOI island 35", and substrate contact 45", all of which may be formed in a manner similar to that described with respect to FIGS. 1-4. As depicted in FIG. 14, a gate 83" is formed on the island 35" using conventional CMOS processes. As further depicted in FIG. 14, a block 250 is formed on a portion of the island 35" containing the substrate contact 45". The block 250 may comprise nitride or any other material suitable for blocking ions from being implanted into the substrate contact 45" and covered portion of the island 35" during subsequent ion implantation steps. The block 250 may be formed using conventional deposition, masking, and etching processes.

Figure 15:
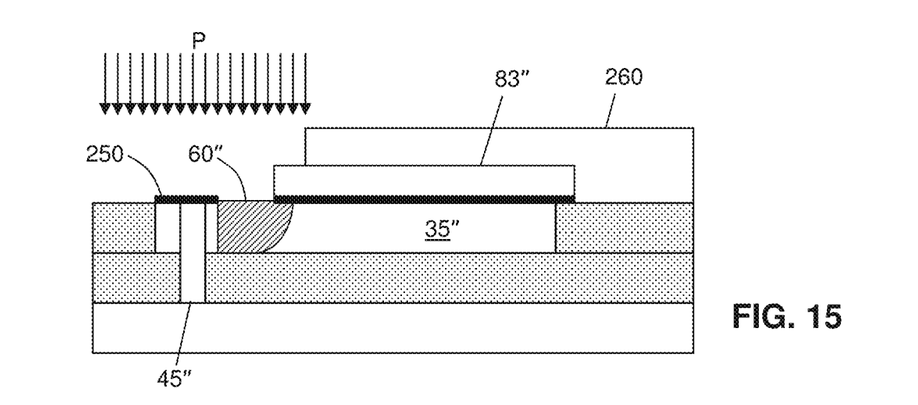

As shown in FIG. 15, a mask 260 is formed over a portion of the gate 83" and the island 35", e.g., by applying, exposing, and developing a photoresist material. The mask 260 is formed with an opening that leaves one end of the gate 83" and an adjacent portion of the island 35" unmasked. A P+ region 60" is formed by doping the unmasked end of the gate 83" and the adjacent portion of the island 35", e.g., using ion implantation as indicated by arrows "P". The mask 260 is then removed. In accordance with aspects of the invention, the doping step does not affect the portion of the island 35" surrounding the substrate contact 45" by virtue of the block 250. The P+ region 60" of the island 35" constitutes a body contact for the gate 83".

Figure 16:
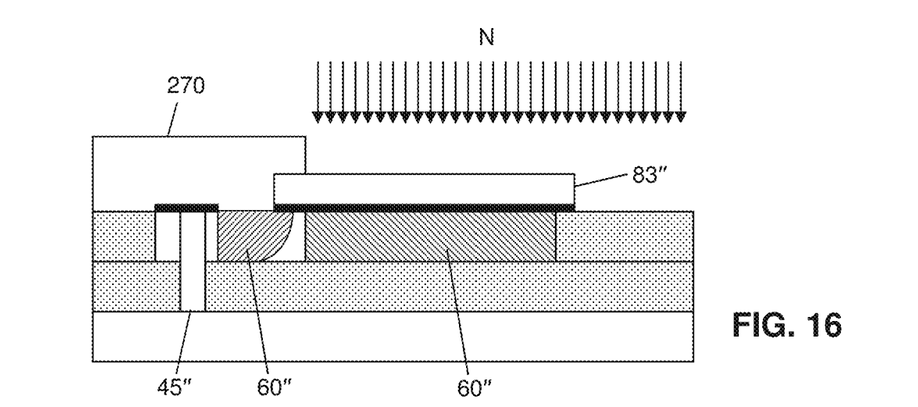

As shown in FIG. 16, another mask 270 is formed on the P+ region 60" and the P+ doped portion of the gate 83", e.g., by applying, exposing, and developing a photoresist material. Unmasked portions of the gate 83" and the island 35" are then doped N+, e.g., using ion implantation, to form the source/drain regions 85a"/85b" as indicated by arrows "N"

Figure 17:
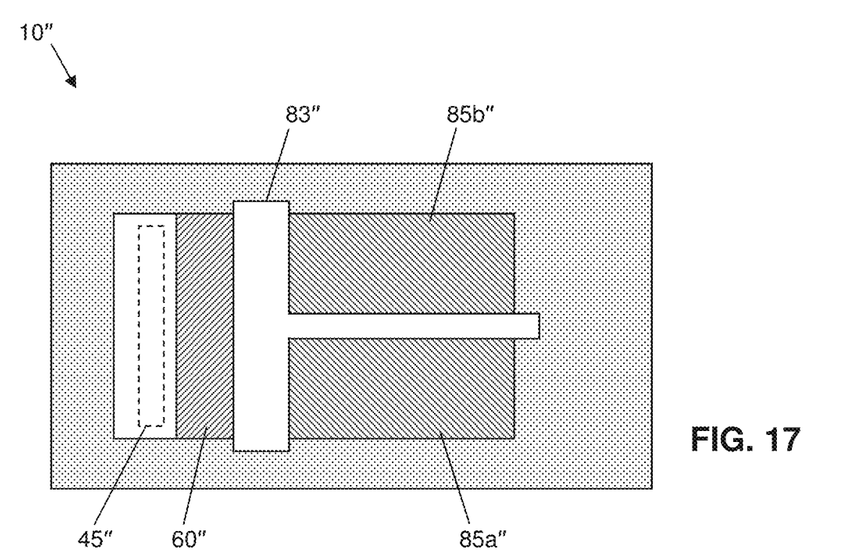

(only source 85a" is shown in FIG. 16, while both source 85a" and drain 85b" are shown in FIG. 17). The mask 270 is then removed.

FIG. 17 is a plan view of the wafer 10" of FIG. 16, and shows the P+ region 60", gate 83", and source/drain regions 85a" and 85b". With reference to FIGS. 16 and 17, the substrate contact 45" is electrically isolated from the source/drain regions 85a"/85b" by the P+ region 60". In this manner, the substrate contact 45" provides a thermal pathway to dissipate heat from the NFET through the substrate while remaining electrically isolated from the NFET.

Figure 18:
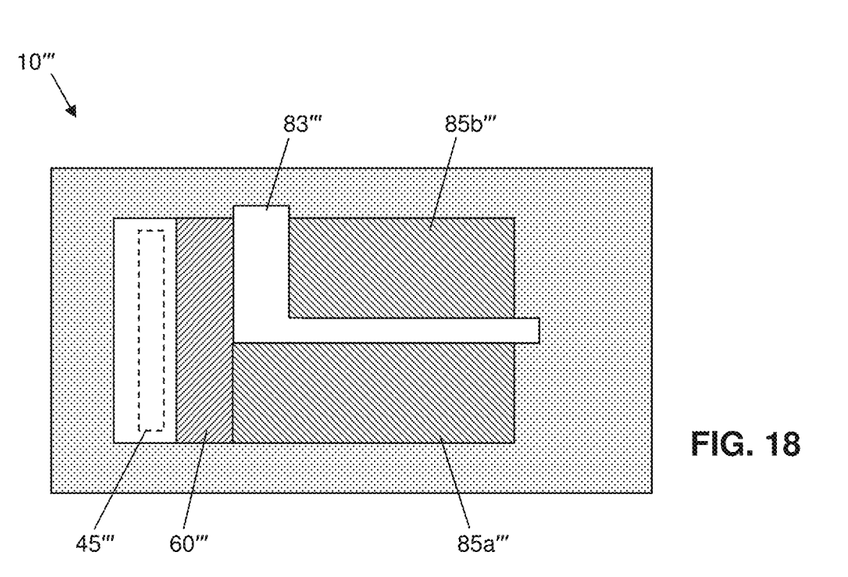

FIG. 18 is a plan view of a wafer 10'" similar to the wafer 10" of FIG. 16, but with an L-shaped gate 83' instead of a T-shaped gate 83". The wafer 10'" may be formed using the same steps as wafer 10", but with differently configured masks for forming the differently shaped gate 83', source region 85a'", and drain region 85b'". As shown in FIG. 18, the source region 85a'" is in direct contact with the body contact, i.e., the P+ region 60'".

Implementations of the invention as described herein can be used to dissipate heat from a FET through the SOI substrate using the substrate contact. The increased heat dissipation permits a FET to utilize increased current, e.g., DC drain current, for a given operating temperature. This is particularly useful in high current devices, such as power amplifiers. Channeling heat into the substrate using a silicon substrate contact reduces, and in some cases removes, the need for conducting heat through wiring that is added in the interlevel dielectric (ILD) layers above the transistors. A transistor's maximum output power and power-added-efficiency is achieved when it is operating under compression, and implementations of the invention provide sufficient drive power to achieve this result.

Figure 19:
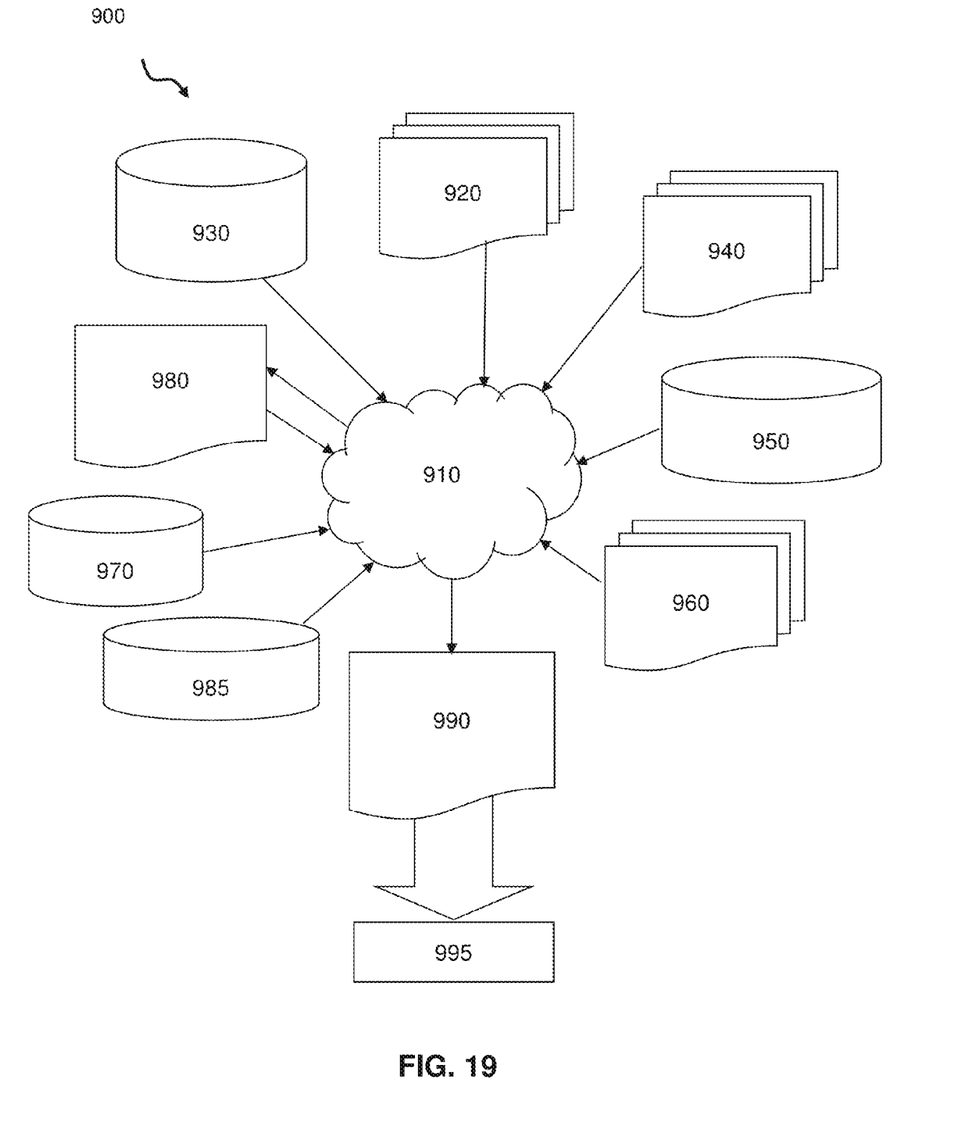
FIG. 19 is a flow diagram of a design process used in semiconductor design, manufacture, and/or test.

FIG. 19 is a flow diagram of a design process used in semiconductor design, manufacture, and/or test. FIG. 19 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-18. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 19 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-18. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-18 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-18. In one embodiment, design structure 990 may comprise a compiled, executable HDL simulation model that functionally simulates the devices shown in FIGS. 1-18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-18. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A semiconductor structure, comprising:
a substrate;
a buried insulator layer on the substrate;
an island of a semiconductor layer on the buried insulator layer;
a substrate contact extending from a first area of the island to the substrate through the buried insulator layer; and
a transistor in a second area of the island,
wherein the substrate contact has a thermal conductivity that is greater than a thermal conductivity of the buried insulator layer;
the substrate, the island, and the substrate contact are all composed of silicon and form a continuous silicon path extending from a channel of the transistor to the substrate;
the substrate contact is electrically isolated from the transistor;
a doped portion of the island electrically isolates the substrate contact from the transistor;
the doped portion and an upper portion of the substrate contact are doped with a first type of impurity;
a source region and a drain region of the transistor are doped with a second type of impurity that is different than the first type of impurity; and
a lower portion of the substrate contact is undoped.

2. The structure of claim 1, wherein the first area of the island directly contacts the second area of the island.

3. A semiconductor structure, comprising:
a substrate;
a buried insulator layer on the substrate;
an island of a semiconductor layer on the buried insulator layer;
a substrate contact extending from a first area of the island to the substrate through the buried insulator layer; and
a transistor in a second area of the island,
wherein the substrate contact comprises a material having a thermal conductivity that is greater than a thermal conductivity of the buried insulator layer; and
the substrate contact is electrically isolated from the transistor,
further comprising a doped region in the island that electrically isolates the substrate contact from the transistor.

4. The structure of claim 3, wherein the doped region surrounds the substrate contact.

5. The structure of claim 3, wherein the doped region is between the substrate contact and a source region and a drain region of the transistor.

6. The structure of claim 5, wherein the doped region comprises a body contact of a gate of the transistor.

7. The structure of claim 3, wherein:
the doped region comprises a first type of impurity; and
a source region and a drain region of the transistor comprise a second type of impurity that is different than the first type of impurity.

8. The structure of claim 5, wherein the doped region directly contacts the source region of the transistor.

9. The structure of claim 3, wherein an upper portion of the substrate contact is doped with a same dopant as the doped region.

10. The structure of claim 9, wherein a lower portion of the substrate contact is undoped.

11. The structure of claim 3, further comprising a nitride blocking element on an upper surface of the substrate contact and an upper surface of the doped region.

12. The structure of claim 11, wherein the nitride blocking element covers an entirety of an interface between the doped region and a source/drain region of the transistor.

13. The structure of claim 3, wherein the doped region is a doped portion of the island, and an uppermost surface of the substrate contact is coplanar with an uppermost surface of the island.

14. The structure of claim 13, wherein:
an uppermost surface of the doped region is coplanar with an uppermost surface of the island; and
a lowermost surface of the doped region is coplanar with a lowermost surface of the island.

15. The structure of claim 3, wherein:
a first lateral side of the doped region directly contacts a shallow trench isolation structure; and
a second lateral side of the doped region, opposite the first lateral side, directly contacts a source region of the transistor.

16. The structure of claim 1, further comprising a nitride blocking element on an upper surface of the substrate contact, an upper surface of the doped portion, and an upper surface of a source/drain region of the transistor, wherein the nitride blocking element covers an entirety of an interface between the doped portion and the source/drain region of the transistor.

17. The structure of claim 1, wherein an uppermost surface of the substrate contact is coplanar with an uppermost surface of the island.

18. A semiconductor structure, comprising:
a substrate;
a buried insulator layer on the substrate;
an island of a semiconductor layer on the buried insulator layer;
a substrate contact extending from a first area of the island to the substrate through the buried insulator layer; and
a transistor in a second area of the island,
wherein the substrate contact has a thermal conductivity that is greater than a thermal conductivity of the buried insulator layer;
the substrate, the island, and the substrate contact are all composed of silicon and form a continuous silicon path extending from a channel of the transistor to the substrate;
the substrate contact is electrically isolated from the transistor;
an uppermost surface of the substrate contact is coplanar with an uppermost surface of the island;
a doped portion of the island electrically isolates the substrate contact from the transistor;
an uppermost surface of the doped portion is coplanar with an uppermost surface of the island; and a lowermost surface of the doped portion is coplanar with a lowermost surface of the island.

19. The structure of claim 18, wherein:

a first lateral side of the doped portion directly contacts a shallow trench isolation structure; and a second lateral side of the doped portion, opposite the first lateral side, directly contacts the source region of the transistor.

* * * * *